(12) United States Patent
Borrello et al.

(10) Patent No.: US 7,084,790 B2
(45) Date of Patent: Aug. 1, 2006

(54) DEVICE TO EFFECTUATE A DIGITAL ESTIMATE OF A PERIODIC ELECTRIC SIGNAL, RELATED METHOD AND CONTROL SYSTEM FOR AN ELECTRIC MOTOR WHICH COMPRISES SAID DEVICE

(75) Inventors: Antonio Borrello, Milan (IT); Stefano Saggini, San Donato Milanese (IT); Aldo Novelli, Loc. S. Lorenzo (IT); Ignazio Bellomo, Rozzano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/006,432

(22) Filed: Dec. 7, 2004

(65) Prior Publication Data

US 2006/0119495 A1   Jun. 8, 2006

(51) Int. Cl.
*H03M 1/48* (2006.01)

(52) U.S. Cl. .................... 341/117; 341/112; 341/113

(58) Field of Classification Search ............... 341/144, 341/145, 120, 163, 164, 165, 161, 162, 111–117, 341/142, 152, 166, 158
See application file for complete search history.

(56) References Cited

U.S. PATENT DOCUMENTS

| 4,134,106 | A | * | 1/1979 | Hungerford | 341/116 |
|---|---|---|---|---|---|
| 4,381,495 | A | * | 4/1983 | Hotta et al. | 341/120 |
| 4,989,001 | A | * | 1/1991 | Serev | 341/116 |
| 5,010,340 | A | * | 4/1991 | Green | 341/172 |
| 5,087,915 | A | * | 2/1992 | Toya | 341/155 |
| 5,140,245 | A | * | 8/1992 | Stacey | 318/723 |
| 5,252,976 | A | * | 10/1993 | Miho et al. | 341/163 |
| 5,727,023 | A | * | 3/1998 | Dent | 375/244 |
| 5,736,953 | A | * | 4/1998 | Yamaguchi | 341/163 |
| 6,016,080 | A | | 1/2000 | Zuta et al. | 331/25 |
| 6,204,783 | B1 | * | 3/2001 | Paz et al. | 341/118 |
| 6,441,600 | B1 | * | 8/2002 | Atallah et al. | 324/76.11 |
| 6,556,164 | B1 | * | 4/2003 | Schmid | 341/163 |
| 6,701,445 | B1 | * | 3/2004 | Majos | 713/500 |

* cited by examiner

*Primary Examiner*—Linh V. Nguyen
(74) *Attorney, Agent, or Firm*—Lisa K. Jorgenson; Robert Iannucci; Seed IP Law Group PLLC

(57) ABSTRACT

A device for effectuating a digital estimate of a periodic electric signal is described. The device comprising a linear DAC having an output signal, a comparator that compares the output signal of the linear DAC with the periodic electric signal, and logic circuitry having in input the output signal of the comparator and a pulse clock signal. The logic circuitry provides a first digital signal in input to the linear DAC and a second digital signal representative of the estimate of the periodic electric signal.

44 Claims, 6 Drawing Sheets

DEVICE TO EFFECTUATE A DIGITAL ESTIMATE OF A PERIODIC ELECTRIC SIGNAL, RELATED METHOD AND CONTROL SYSTEM FOR AN ELECTRIC MOTOR WHICH COMPRISES SAID DEVICE

BACKGROUND OF THE INVENTION

1. Field of the Invention

The present invention refers to a device to effectuate a digital estimate of a periodic electric signal, to a related method, and a control system for an electric motor, particularly for a bipolar stepper motor, which comprises said device.

2. Description of the Related Art

Stepper motors are known in the state of the art. A typical stepper motor comprises a stator, where there are the windings constituting the phases of the motor, and a rotor including teeth which cause the rotation step.

The stepper motors allow obtaining a high precision control of the movement and for this reason they must have an accurate control system.

A typical control system of a bipolar stepper motor is shown in FIG. 1. A control device 1 controls a power stage of the stepper motor which is constituted by a full-bridge 2 coupled with the supply voltage Vcc and ground. By means of a sense resistance Rs it is possible to obtain a voltage signal Vs proportional to the current flowing through a phase winding of the motor. The voltage signal Vs is compared by means of a comparator 3 with an output signal of a sinusoidal DAC 4. A controller 5 supplies the input signals of the sinusoidal DAC that sets the current level so as to assure a precise peak value of the phase current.

The control system in FIG. 1 has a high circuital complexity due above all to the presence of the sinusoidal DAC and it is not adaptable to the different circuital appliances.

BRIEF SUMMARY OF THE INVENTION

An embodiment of the present invention provides a device to effectuate a digital estimate of a periodic electric signal which is less complex and more precise than the device of prior art.

According to one embodiment of the present invention, the device includes a linear DAC having an output signal, a comparator that compares the output signal of the linear DAC with the periodic electric signal, and a logic circuitry having in input the output signal of the comparator and a pulse clock signal. The logic circuitry provides a first digital signal in input to the linear DAC and a second digital signal representative of the estimate of the periodic electric signal.

BRIEF DESCRIPTION OF THE SEVERAL VIEWS OF THE DRAWING(S)

The features and the advantages of the present invention will be made evident by the following detailed description of one particular embodiment, illustrated as a not limiting example in the annexed drawings, wherein.

DETAILED DESCRIPTION OF THE INVENTION

Figure 2:
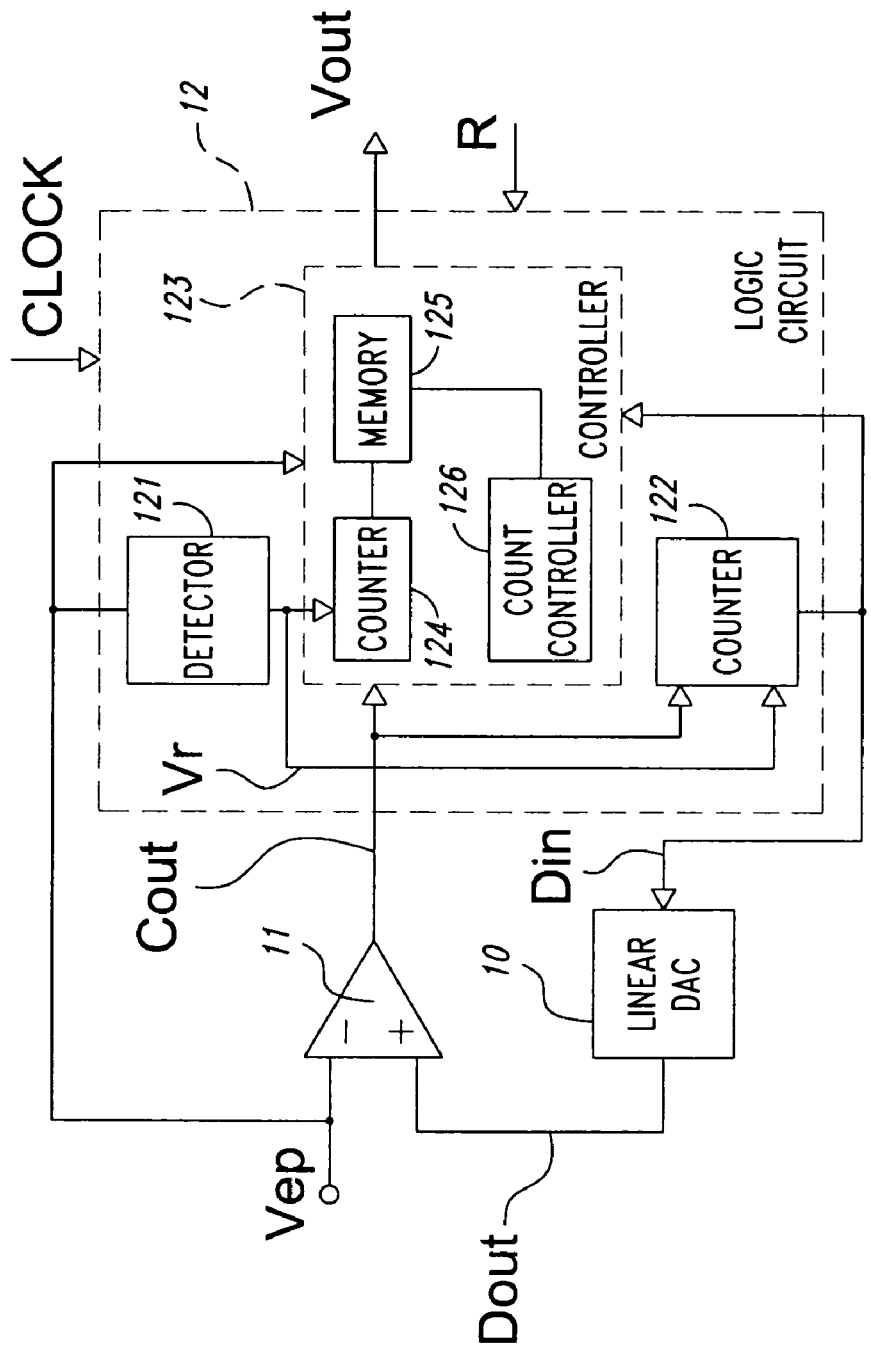
FIG. 2 is a schematic view of a device for effectuating the digital estimate of a periodic electric signal according to the present invention.

With reference to FIG. 2 a schematic view of a device for effectuating a digital estimate of a periodic electric signal Vep is shown. The device comprises a linear DAC 10 having an output signal Dout, a comparator 11 that compares the output signal Dout of the linear DAC 10 with the periodic electric signal Vep, a logic circuitry 12 having in input the output signal Cout of the comparator 11 and providing a first digital signal Din in input to the linear DAC and a second digital signal Vout representative of the estimate of the periodic electric signal Vep. The output signal Cout of the comparator 11 has a low value LOW if the signal Dout is lower than the signal Vep while it has a high value HIGH if the signal Dout is higher than the signal Vep. The logic circuitry is provided with a clock signal CLOCK and a reset signal R.

Figure 1:
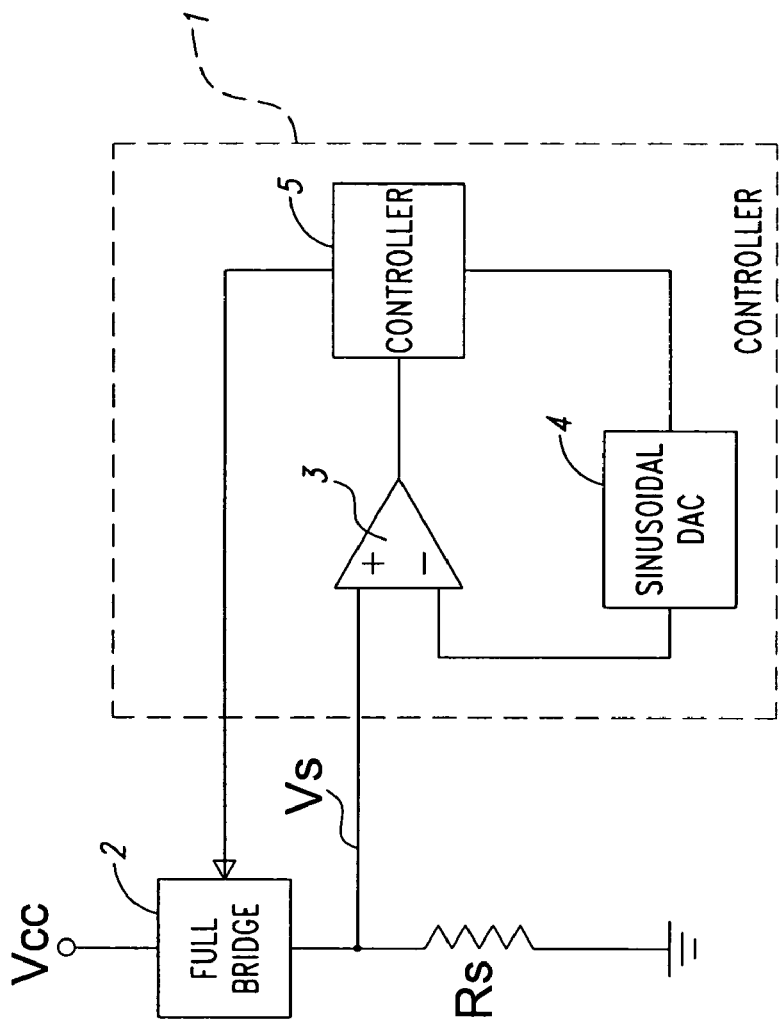
FIG. 1 is a schematic view of a control system for a bipolar stepper motor in accordance with prior art.
Figure 3:
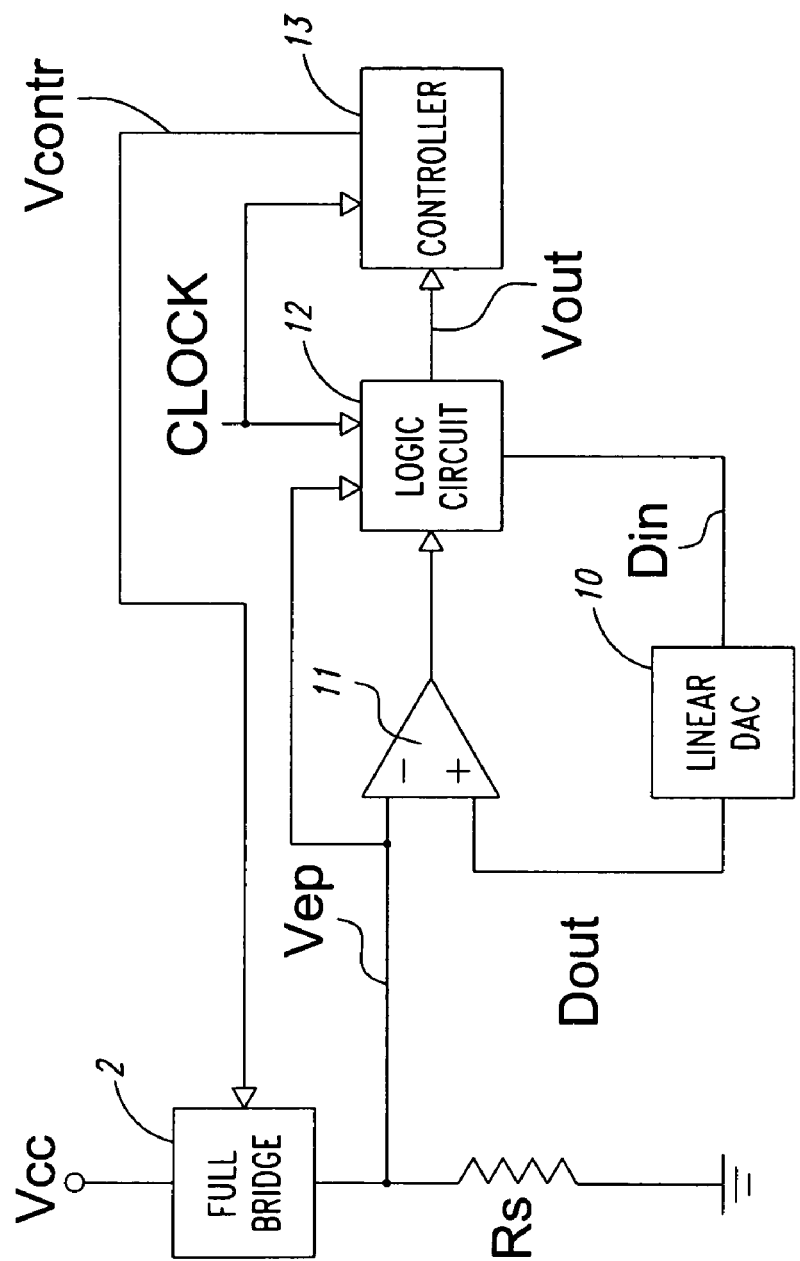
FIG. 3 is a schematic view of a control system for a stepper motor according to the present invention.

In FIG. 3 a schematic view of a control system for a stepper motor according to the present invention is shown; the elements equal to the elements of the circuits in FIGS. 1 and 2 will be indicated with the same references. The control system comprises the device in FIG. 2 which is applied to the voltage Vep deriving from the terminals of a sense resistance Rs of a power stage 2 of a stepper motor; the power stage 2 is constituted of a full-bridge and it is supplied by the supply voltage Vcc. The output voltage Vout of the logic circuitry 12 is sent to a controller device 13 that controls the full-bridge 2 using a signal Vcontr.

The logic circuitry 12, as shown in FIG. 2, comprises a detector 121 that detects the ascending or descending waveform of the periodic electric signal Vep and generates an output signal Vr representative of said detection, a counter 122 that sets a new value of the signal Din in response to a value changing of the output signal Cout of the comparator 11 and in response to the output signal Vr of the detector 121. More precisely the counter 122 sets a new value of the signal Din in response to the signal Cout changing from the low value LOW to the high value HIGH or from the high value HIGH to the low value LOW respectively in the case of descending or ascending waveform of the periodic electric signal Vep.

The logic circuitry 12 comprises a controller 123 that sets a new value of the signal Vout in response to the signal Cout and the output signal Vr of the detector 121 and until the same signal Cout changes value or the value of the signal Vout reaches the actual value of the signal Din. More precisely the controller 123 sets a new value of the signal Vout in response to the high value HIGH of the signal Cout in the case of ascending waveform of the signal Vep or in response to the low value LOW of the signal Cout in the case of descending waveform of the signal Vep.

More precisely, the counter 122 is connected to the detector 121 and sets the new values of the signal Din. The counter adds to or subtracts from the signal Din a bit number L in correspondence with the ascending or descending waveform of the signal Vep and respectively when the signal Cout assumes the low value LOW or when the signal Cout assumes the high value HIGH.

The controller 123 comprises a counter 124 that sets the new values of the signal Vout; said counter adds to or subtracts from the signal Vout, at each pulse of the signal CLOCK, a LSB of the signal Vout in correspondence with an ascending or descending waveform of the signal Vep and respectively when the signal Cout assumes the high value HIGH or the low value LOW and until the same signal Cout changes value or the value of the signal Vout reaches the actual value of the signal Din. Normally the bit number N of the digital signal Vout is higher than the bit number P of the signal Din. For example the signal Din is a digital word at three bits and the digital signal Vout is a digital word at six bits. The digital signal Vout is formed by P more significant bits and N-P less significant bits.

Preferably the bit number L, added or subtracted from Din, is comprised between 1 and $2^{N-P}$ and more preferably the bit number L is equal to a LSB (Least Significant Bit) of the signal Din; hereinafter the bit number L is set equal to a LSB (Least Significant Bit) of the signal Din.

Particularly, the controller 123 is connected with the detector 121 and the counter 122 and comprises a control and memory device 125 structured to store the preceding value Dinp and the current value Dinc of the signal Din and to verify if the signal Vep has a value equal to or different from zero. Said control and memory device 125 sets, initially at the start-up and when the value of the signal Vep is not zero, the value of the signal Vout to a value given by half the difference between the current value Dinc of the signal Din and the preceding value Dinp of the signal Din. If initially at the start-up the value of the signal Vep is zero, the device 125 sets the value of the signal Vout to a value given by the preceding value Dinp of the signal Din. Successively, if the signal Cout assumes the high level HIGH in the case of ascending waveform of the signal Vep or if the signal Cout assumes the low value LOW in the case of descending waveform of the signal Vep, the counter 124 adds to or subtracts from the digital signal Vout a LSB at each pulse of the clock signal CLOCK. This happens until the same signal Cout changes value or the value of the signal Vout reaches the actual value Dina of the signal Din.

The same control and memory device 125, when the signal Cout changes value, sets the signal Vout at the preceding value Dinp of the signal Din. Successively, if the signal Cout assumes the high level HIGH in the case of ascending waveform of the signal Vep or if the signal Cout assumes the low value LOW in the case of descending waveform of the signal Vep, the counter 124 adds to or subtracts from the digital signal Vout a LSB of the digital signal Vout at each pulse of the clock signal CLOCK.

The controller 123 comprises a counter controller 126 that ensures that the value of the digital signal Vout does not overcome the actual value Dina of the digital signal Din. Therefore the count controller 124 stops the counter 124 from adding to or subtracting from the signal Vout of a LSB at each pulse of the clock signal CLOCK when the digital signal Vout reaches the actual value Dina of the digital signal Din. At each successive pulse of the clock signal CLOCK, the signal Vout does not change until the signal Cout changes value.

Figure 4:
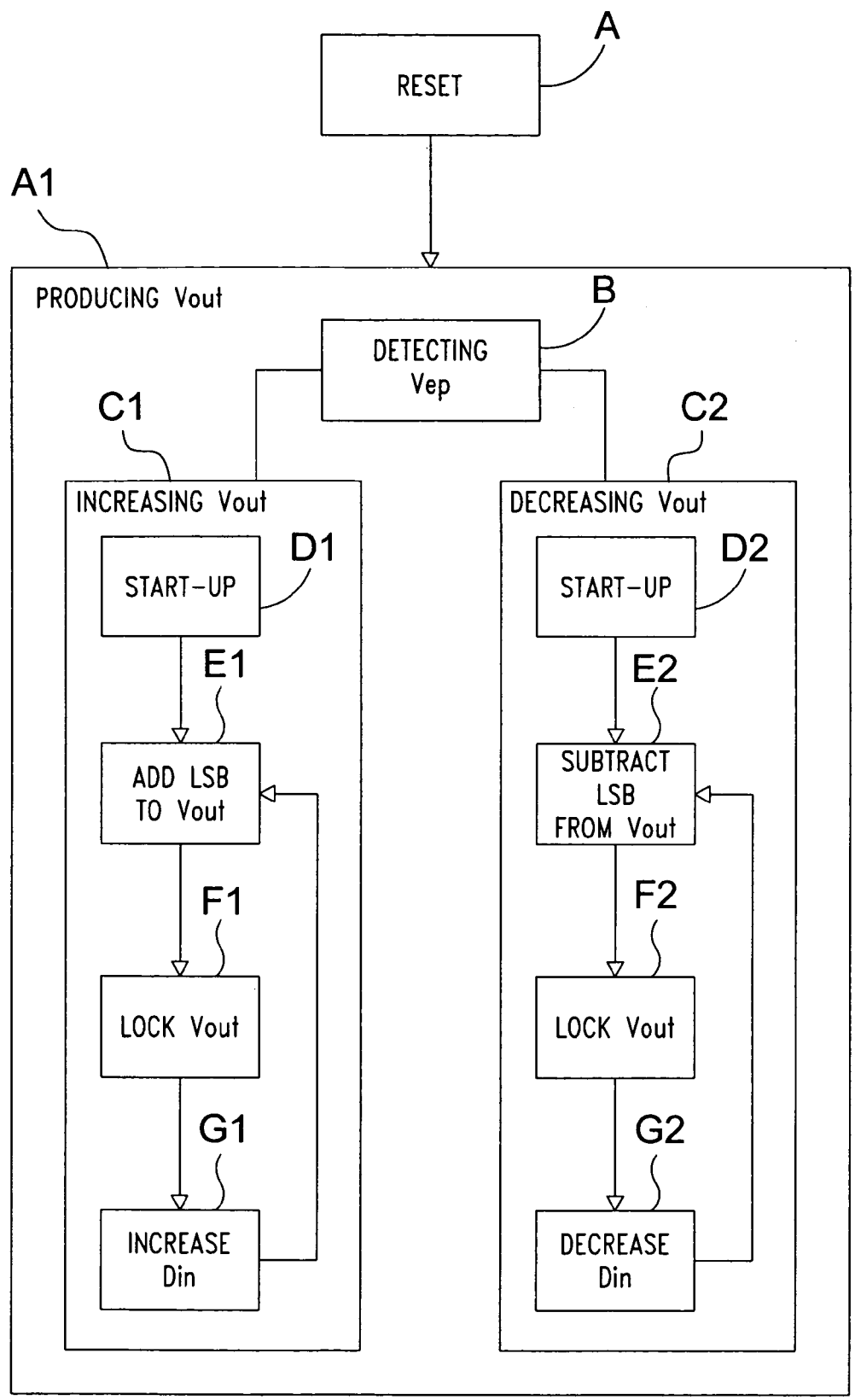
FIG. 4 is a flow diagram of a method for effectuating the digital estimate of the periodic electric signal according to the present invention.

Hereinafter one operation method of the device shown in FIG. 2 will be explained (FIG. 4).

Initially there is a reset step A wherein all the counters are set at zero; if the digital signal Din is a digital word at three bits it has Din=000 and if the digital signal Vout is a digital word at six bits it has Vout=000000.

After the reset step A there is a step A1 for comparing the output signal Dout of the linear DAC 10 with the periodic electric signal Vep and for setting the digital signal Din in input to the linear DAC 10 and the digital signal Vout representative of the estimate of the periodic electric signal in response to the signal Cout deriving from said comparison.

The step A1 comprises a detect step B wherein the detector 121 detects if the waveform of the signal Vep is ascending or descending and locking steps C1 and C2 that increase or decrease Vout in accordance with the ascending or descending waveform of the signal Vep respectively.

The steps C1 and C2 comprise start-up steps D1 and D2 for setting the values of the signals Din and Vout and for verifying if the signal Vep assumes a value zero. In these steps D1 and D2, the counter 122 sets the value of the digital signal Din in response to the signal Cout changing from the low value LOW to the high value HIGH (step D2) or from the high value HIGH to the low value LOW (step D1). More precisely in the step D1, at each value changing of the signal Cout from the high value HIGH to the low value LOW, the bit number L of the signal Din is increased, L preferably being the LSB of the digital signal Din. In the step D2, at each value changing of the signal Cout from the low value LOW to the high value HIGH, the bit number L of the signal Din is decreased, again L preferably being the LSB of the digital signal Din. In these same steps D1 and D2, if the signal Vep is different from zero, at each value changing of the signal Cout from the high value HIGH to the low value LOW (step D1) or at each value changing of the signal Cout from the low value LOW to the high value HIGH (step D2), the signal Vout is set equal to half the difference between the actual value and the preceding value of the signal Din. If the signal Vep is equal to zero the signal Vout is set equal to the preceding value of the signal Din. Then the signal Cout assumes the high value HIGH in the step D1 and the low value LOW in the step D2.

Since the number N of the bits of the digital word Vout is higher than the number P of the digital word Din, the digital word Vout is formed by P more significant bits and N-P less significant bits. For example, if the preceding value Dinp of the digital signal Din is Dinp=011 and the actual Dina value of the digital signal Din is Dina=111, the value of the digital signal Vout=011101 where the three more significant bits assume the value Dinp of the preceding digital signal Din and the remaining less significant bits are set to the value 101 that is at the average of the preceding and actual value of the digital signal Din. In this way the signal Vout, that is the digital estimate of the signal Vep, draws near the real value; the error that is committed is equal to half the LSB of the digital signal Din.

In successive steps E1 and E2 only the value of the digital signal Vout will be set; particularly, since the number N of the bits of the digital word Vout is higher than the number P of the digital word Din and the digital word Vout is formed by P more significant bits and N-P less significant bits, in these steps E1 and E2, at each pulse of the clock signal CLOCK, only the N-P bits of the digital word Vout will be changed by adding (in the step E1 that is in the case of ascending waveform of the signal Vep) or by subtracting (in the step E2 that is in the case of descending waveform of the signal Vep) a least significant bit.

These steps E1 and E2 persist until the signal Cout changes value, that is if the signal Cout changes from the high value HIGH to the low value LOW (step D1) or the signal Cout changes from the low value LOW to the high value HIGH (step D2), or until the digital signal Vout reaches the actual value Dina of the digital signal Din.

In the last case there are the steps F1 and F2 wherein the count controller 126, when the digital signal Vout is equal to the actual value Dina of digital signal Din, causes the counter 124 to stop increasing or decreasing the digital signal Vout with a LSB. In the last way the committed valuation error does not increase and the estimate of the signal Vep, that is the signal Vout, does not diverge because it is blocked at the actual value of the digital signal Din.

After the steps F1, F2 or the steps E1, E2 there are the steps G1 and G2 when the signal Cout changes value, that is the signal Cout changes from the high value HIGH to the low value LOW (step G1) or the signal Cout changes from the low value LOW to the high value HIGH (step G2). In these steps G1 and G2 the LSB of the digital signal Din is increased (step G1) or decreased (step G2) while the digital signal Vout is set to the preceding value Dinp of the digital signal Din. Then the signal Cout assumes the high value HIGH in the step G1 and the low value LOW in the step G2 and the method follows with the steps E1 and E2.

Figure 5:
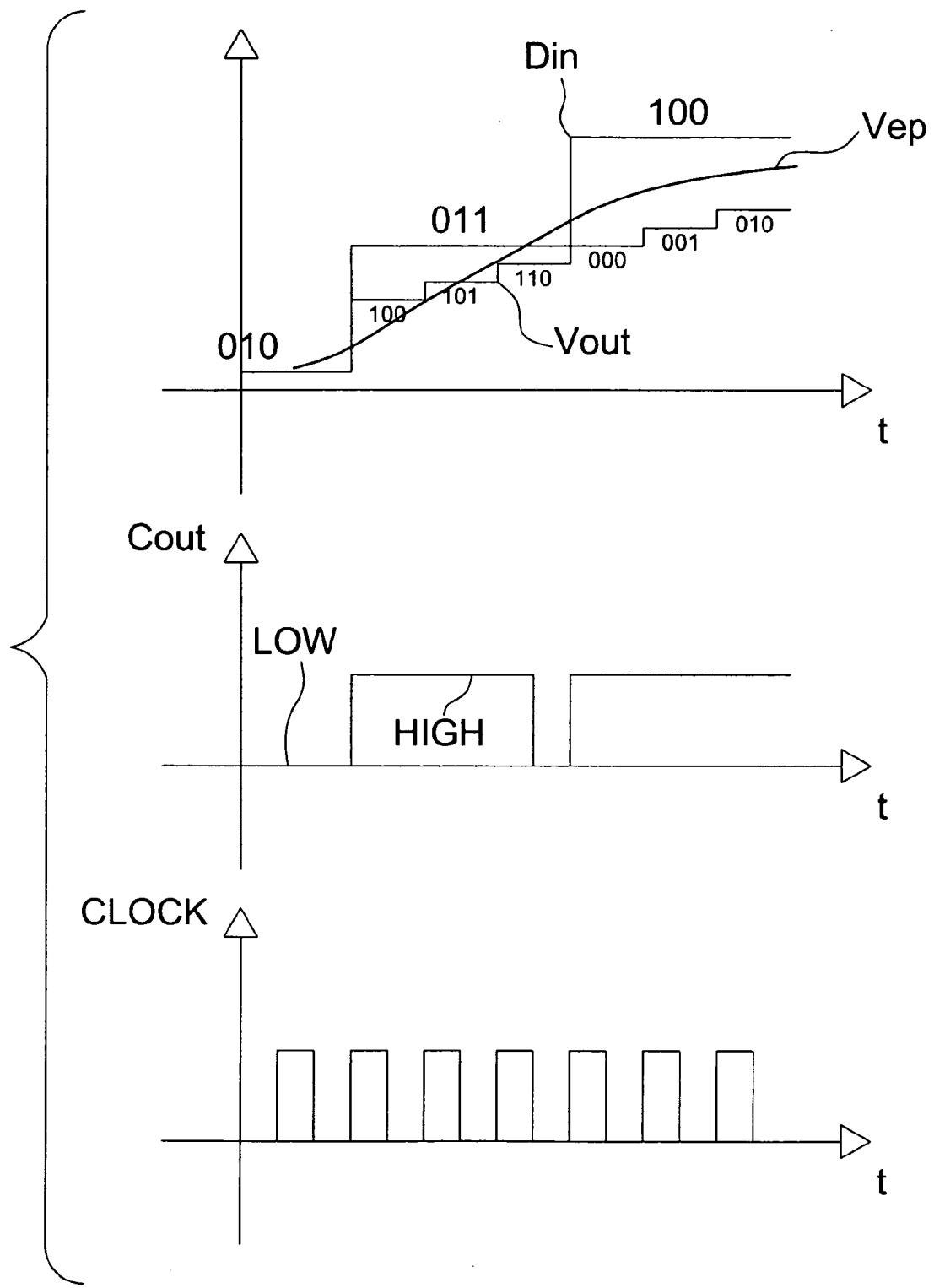
FIG. 5 shows time diagrams of the electric signals of the circuit in FIG. 2 in one operation phase.

FIG. 5 shows the time diagrams of the signals Din, Vout, and Vep and the time diagrams of the signal Cout and CLOCK in the operation case wherein the signal Vep has an ascending waveform and the signal Vout is increased until the signal Cout goes down to the low value LOW. In FIG. 5 it is shown that the value changing of the signals Din and Vout happens with a delay due to the DAC 10 and to the logic circuitry 12.

Figure 6:
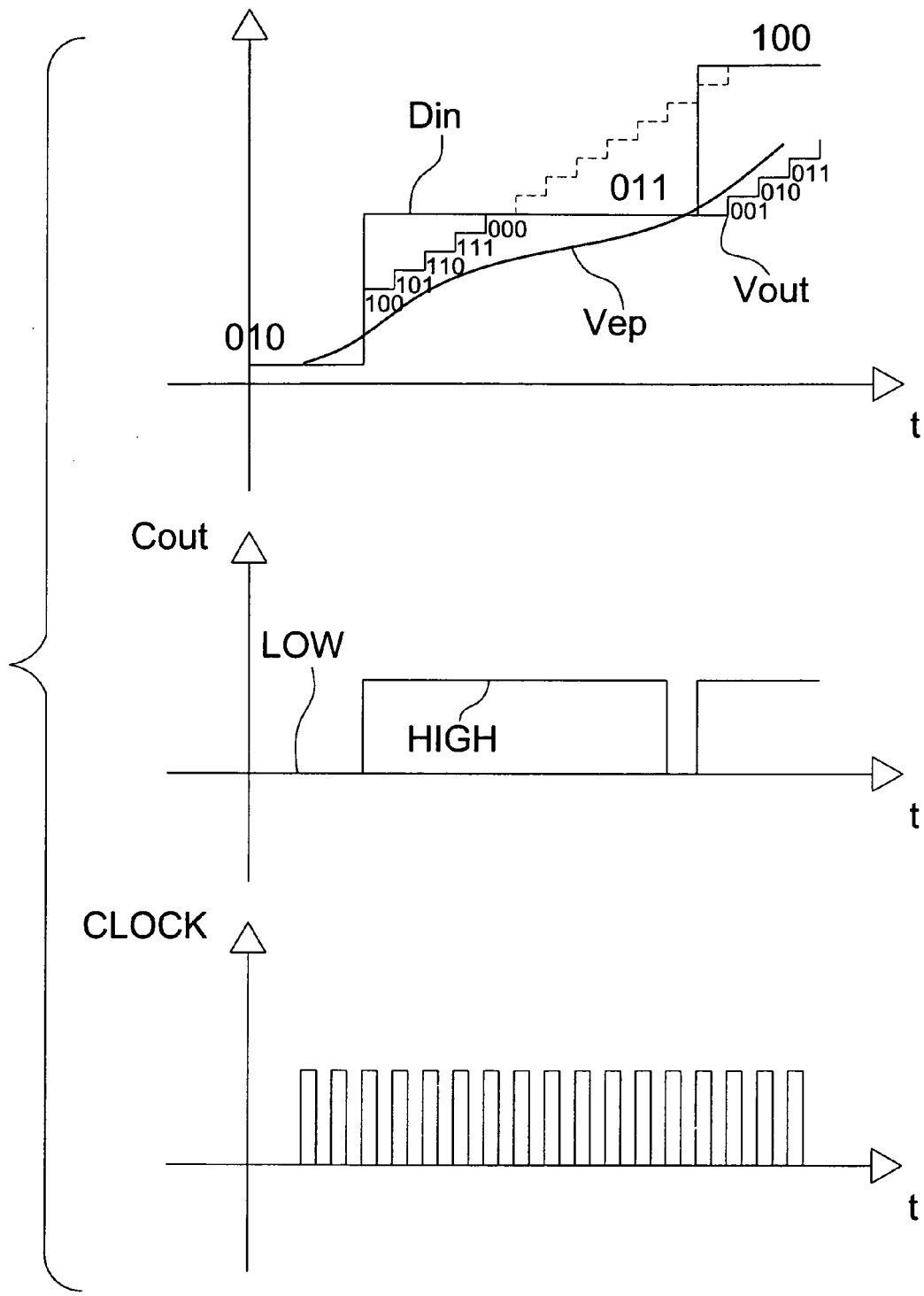
FIG. 6 shows time diagrams of the electric signals of the circuit in FIG. 2 in one operation phase different from that in FIG. 5.

FIG. 6 shows the time diagrams of the signals Din, Vout, and Vep and the time diagrams of the signal Cout and CLOCK in the operation case wherein the signal Vep has an ascending waveform and the signal Vout is increased until reaches the current value Dinc of the digital signal Din. As is visible in the same Figure when the signal Vout reached the current value Dinc (Dinc=011) of the signal Din is not more incremented for the successive clock pulses until the signal Cout goes down to the low value LOW and then returns to the high value HIGH. In the same figure it is shown, in sketched line, the signal Vout in the case wherein the control means 124 are not present; the signal Vout goes away from the signal Vep and the valuation error increases. In FIG. 6 it is shown that the value changing of the signals Din and Vout happens with a delay due to the DAC 10 and to the logic circuitry 12.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A device for effectuating a digital estimate of a periodic electric signal, said device comprising:
    a linear DAC having an output signal;
    comparing means for comparing said output signal of the linear DAC with said periodic electric signal and producing an output signal based on the comparing; and
    a logic circuitry having in input the output signal of the comparing means and a pulse clock signal, said logic circuitry providing a first digital signal in input to the linear DAC and a second digital signal representative of the estimate of the periodic electric signal, wherein said first digital signal is formed by a number P of bits, where P is an integer number, and the second digital signal is formed by a number N of bits, where N is an integer number, the number N being higher than the number P, the second digital signal being formed by P more significant bits and N-P less significant bits.

2. A device according to claim 1, wherein said output signal of the comparing means assumes a first or a second value and said logic circuitry comprises:
    first means for detecting an ascending or descending waveform of the periodic electric signal and generating a detection signal which is representative of the detection;
    second means for setting a new value of the first digital signal in response to the output signal of the comparing means changing from the first value to the second value and in response to the detection signal; and
    third means for setting, at each clock pulse, a new value of the second digital signal in response to the output signal of the comparing means and in response to said detection signal.

3. A device according to claim 2, wherein the second means set a new value of the first digital signal by adding or subtracting a bit number comprised between 1 and $2^{N-P}$ in accordance with the ascending or descending waveform of the periodic electric signal.

4. A device according to claim 3, wherein the second means set a new value of the first digital signal by adding or subtracting a least significant bit of the first digital signal in accordance with the ascending or descending waveform of the periodic electric signal.

5. A device according to claim 3, wherein the third means set a new value of the second digital signal by adding or subtracting a least significant bit of the second digital signal, at each clock pulse, in accordance with the ascending or descending waveform of the periodic electric signal and in response to the first value of the output signal of the comparing means.

6. A device according to claim 5, wherein the third means comprise control and memory means for storing a preceding and a current value of the first digital signal.

7. A device according to claim 6, wherein said control and memory means set the value of the second digital signal equal to the preceding value of the first digital signal in response to the output signal of the comparing means changing from the first value to the second value.

8. A device according to claim 6, wherein said control and memory means are structured to check if the value of the periodic electric signal is zero, and set the second digital signal to a value given by half the difference between the current value and the preceding value of the first digital signal, when the output signal of the comparing means assumes the second value and the value of the periodic electric signal is different from zero.

9. A device according to claim 6, wherein the third means comprise control means for blocking the adding or the subtraction of a least significant bit at each pulse clock when the value of the second digital signal is equal to the current value of the first digital signal.

10. A device according to claim 2 wherein said first value and said second value are respectively equal to a high value and a low value of the output signal of the comparing means when the waveform of the periodic electric signal is ascending.

11. A device according to claim 2 wherein said first value and said second value are respectively equal to a low value and a high value of the output signal of the comparing means when the waveform of the periodic electric signal is descending.

12. A control system for an electric motor, comprising:
a power stage supplied by a supply voltage;
a sense resistance coupled with the power stage and structured to provide an electric periodic signal;
a control circuit configured to control said power stage; and
a device for effectuating a digital estimate of the periodic electric signal, said device including:
a linear DAC having an output signal;
comparing means for comparing said output signal of the linear DAC with said periodic electric signal and producing an output signal; and
a logic circuitry having in input the output signal of the comparing means and a pulse clock signal, said logic circuitry providing a first digital signal in input to the linear DAC and a second digital signal representative of the estimate of the periodic electric signal, wherein said first digital signal is formed by a number P of bits, where P is an integer number, and the second digital signal is formed by a number N of bits, where N is an integer number, the number N being higher than the number P, the second digital signal being formed by P more significant bits and N-P less significant bits.

13. A control system according to claim 12, wherein said output signal of the comparing means assumes a first or a second value and said logic circuitry comprises:
first means for detecting an ascending or descending waveform of the periodic electric signal and generating a detection signal which is representative of the detection;
second means for setting a new value of the first digital signal in response to the output signal of the comparing means changing from the first value to the second value and in response to the detection signal; and
third means for setting, at each clock pulse, a new value of the second digital signal in response to the output signal of the comparing means and in response to said detection signal.

14. A control system according to claim 13, wherein the second means set a new value of the first digital signal by adding or subtracting a bit number comprised between 1 and $2^{N-P}$ in accordance with the ascending or descending waveform of the periodic electric signal.

15. A control system according to claim 14, wherein the second means set a new value of the first digital signal by adding or subtracting a least significant bit of the first digital signal in accordance with the ascending or descending waveform of the periodic electric signal.

16. A control system according to claim 15, wherein the third means set a new value of the second digital signal by adding or subtracting a least significant bit of the second digital signal, at each clock pulse, in accordance with the ascending or descending waveform of the periodic electric signal and in response to the first value of the output signal of the comparing means.

17. A control system according to claim 16, wherein the third means comprise control and memory means for storing a preceding and a current value of the first digital signal.

18. A control system according to claim 17, wherein said control and memory means set the value of the second digital signal equal to the preceding value of the first digital signal in response to the output signal of the comparing means changing from the first value to the second value.

19. A control system according to claim 17, wherein said control and memory means are structured to check if the value of the periodic electric signal is zero, and set the value of the second digital signal to a value given by half the difference between the actual value and the preceding value of the first digital signal, when the output signal of the comparing means assumes the second value and the value of the periodic electric signal is different from zero.

20. A control system according to claim 17, wherein the third means comprise control means for blocking the adding or the subtracting of a least significant bit at each pulse clock when the value of the second digital signal is equal to the current value of the first digital signal.

21. A control system according claim 13 wherein said first value and said second value are respectively equal to a high value and a low value of the output signal of the comparing means when the waveform of the periodic electric signal is ascending.

22. A control system according to claim 13 wherein said first value and said second value are respectively equal to a low value and a high value of the output signal of the comparing means when the waveform of the periodic electric signal is descending.

23. A control system according to claim 12, wherein said motor is a bipolar stepper motor.

24. A method for effectuating a digital estimate of a periodic electric signal, said method comprising:
comparing an output signal of a linear DAC with said periodic electric signal; and
setting a first digital signal in input to the linear DAC and a second digital signal representative of the estimate of the periodic electric signal in response to a signal deriving from said comparing, wherein said first digital signal is formed by a number P of bits, where P is an integer number, and the second digital signal is formed by a number N of bits, where N is an integer number, the number N being higher than the number P, the second digital signal being formed by P more significant bits and N-P less significant bits.

25. A method according to claim 24, wherein said signal deriving from said comparison assumes a first or a second value, said setting step comprises:
detecting an ascending or descending waveform of the periodic electric signal;
setting a new value of the first digital signal in response to the output signal derived from said comparison changing from the first value to the second value and in response to the detection of the ascending or descending waveform of the periodic electric signal; and
setting, at each clock pulse, a new value of the second digital signal in response to the output signal derived from the comparison and in response to said detection of the ascending or descending waveform of the periodic electric signal.

26. A method according to claim 25, wherein the setting of a new value of the first digital signal is effectuated by adding or subtracting a bit number comprised between 1 and $2^{N-P}$ in accordance with the ascending or descending waveform of the periodic electric signal.

27. A method according to claim 26, wherein the setting of a new value of the first digital signal is effectuated by adding or subtracting a least significant bit of the first digital signal in accordance with the ascending or descending waveform of the periodic electric signal.

28. A method according to claim 26 wherein the setting of a new value of the second digital signal is effectuated by adding or subtracting a least significant bit of the second digital signal, at each clock pulse, in accordance with the ascending or descending waveform of the periodic electric signal and in response to the first value of the output signal derived from said comparison.

29. A method according to claim 28, wherein said setting step comprises storing a preceding and a current value of the first digital signal.

30. A method according to claim 29, wherein said setting step comprises setting the value of the second digital signal equal to the preceding value of the first digital signal in response to the output signal derived from said comparison changing from the first value to the second value.

31. A method according to claim 28, wherein said setting step comprises a start-up step that checks if the value of the periodic electric signal is zero and sets the value of the second digital signal to a value given by half the difference between the actual value and the preceding value of the first digital signal, when the output signal of said comparison assumes the second value and the value of the periodic electric signal is different from zero, or sets the value of the second digital signal to the preceding value of the first digital signal, when the output signal derived from said comparison assumes the second value and the value of the periodic electric signal is zero.

32. A method according to claim 28, wherein said setting step comprises blocking the adding or the subtraction of a least significant bit to the second digital signal, at each pulse, clock when the value of the second digital signal is equal to the current value of the first digital signal.

33. A method according to claim 25 wherein said first value and said second value are respectively equal to a high value and a low value of the signal deriving from the comparison when the waveform of the periodic electric signal is ascending.

34. A method according to claim 25 wherein said first value and said second value are respectively equal to a low value and a high value of the signal deriving from the comparison when the waveform of the periodic electric signal is descending.

35. A device for effectuating a digital estimate of a periodic electric signal, said device comprising:
a linear DAC having an output signal;
comparing means for comparing said output signal of the linear DAC with said periodic electric signal and producing an output signal based on the comparing; and
logic circuitry having in input the output signal of the comparing means and a pulse clock signal, said logic circuitry providing a first digital signal in input to the linear DAC and a second digital signal representative of the estimate of the periodic electric signal, wherein said output signal of the comparing means assumes a first or a second value and said logic circuitry comprises:
first means for detecting an ascending or descending waveform of the periodic electric signal and generating a detection signal which is representative of the detection;
second means for setting a new value of the first digital signal in response to the output signal of the comparing means changing from the first value to the second value and in response to the detection signal; and
third means for setting, at each clock pulse, a new value of the second digital signal in response to the output signal of the comparing means and in response to said detection signal.

36. A device according to claim 35 wherein said first value and said second value are respectively equal to a high value and a low value of the output signal of the comparing means when the waveform of the periodic electric signal is ascending.

37. A device according to claim 35 wherein said first value and said second value are respectively equal to a low value and a high value of the output signal of the comparing means when the waveform of the periodic electric signal is descending.

38. A control system for an electric motor, comprising:
a power stage supplied by a supply voltage;
a sense resistance coupled with the power stage and structured to provide an electric periodic signal;
a control circuit configured to control said power stage; and
a device for effectuating a digital estimate of the periodic electric signal, said device including:
a linear DAC having an output signal;
comparing means for comparing said output signal of the linear DAC with said periodic electric signal and producing an output signal; and
a logic circuitry having in input the output signal of the comparing means and a pulse clock signal, said logic circuitry providing a first digital signal in input to the linear DAC and a second digital signal representative of the estimate of the periodic electric signal, wherein said output signal of the comparing means assumes a first or a second value and said logic circuitry comprises:
first means for detecting an ascending or descending waveform of the periodic electric signal and generating a detection signal which is representative of the detection;
second means for setting a new value of the first digital signal in response to the output signal of the comparing means changing from the first value to the second value and in response to the detection signal; and
third means for setting, at each clock pulse, a new value of the second digital signal in response to the output signal of the comparing means and in response to said detection signal.

39. A control system according claim 38 wherein said first value and said second value are respectively equal to a high value and a low value of the output signal of the comparing means when the waveform of the periodic electric signal is ascending.

40. A control system according to claim 38 wherein said first value and said second value are respectively equal to a low value and a high value of the output signal of the comparing means when the waveform of the periodic electric signal is descending.

41. A control system according to claim 38, wherein said motor is a bipolar stepper motor.

42. A method for effectuating a digital estimate of a periodic electric signal, said method comprising:
comparing an output signal of a linear DAC with said periodic electric signal; and
setting a first digital signal in input to the linear DAC and a second digital signal representative of the estimate of the periodic electric signal in response to a signal deriving from said comparing, wherein said signal deriving from said comparison assumes a first or a second value, said setting step comprises:
detecting an ascending or descending waveform of the periodic electric signal;
setting a new value of the first digital signal in response to the output signal derived from said comparison changing from the first value to the second value and in response to the detection of the ascending or descending waveform of the periodic electric signal; and setting, at each clock pulse, a new value of the second digital signal in response to the output signal derived from the comparison and in response to said detection of the ascending or descending waveform of the periodic electric signal.

43. A method according to claim 42 wherein said first value and said second value are respectively equal to a high value and a low value of the signal deriving from the comparison when the waveform of the periodic electric signal is ascending.

44. A method according to claim 42 wherein said first value and said second value are respectively equal to a low value and a high value of the signal deriving from the comparison when the waveform of the periodic electric signal is descending.

* * * * *